(12) United States Patent
Kimura et al.

(10) Patent No.: US 7,843,229 B2
(45) Date of Patent: Nov. 30, 2010

(54) SIGNAL OUTPUT CIRCUIT

(75) Inventors: Kenji Kimura, Kanagawa (JP);
Masanori Sato, Kanagawa (JP)

(73) Assignee: NEC Electronics Corporation,
Kawasaki, Kanagawa (JP)

( * ) Notice: Subject to any disclaimer, the term of this patent is extended or adjusted under 35 U.S.C. 154(b) by 59 days.

(21) Appl. No.: 12/382,833

(22) Filed: Mar. 25, 2009

(65) Prior Publication Data

US 2009/0243691 A1    Oct. 1, 2009

(30) Foreign Application Priority Data

Mar. 25, 2008    (JP)    .............................. 2008-078468

(51) Int. Cl.
*H03K 5/153*    (2006.01)
(52) U.S. Cl. .............................. 327/59; 327/72; 327/73; 327/77; 327/87; 327/89
(58) Field of Classification Search ........................ None
See application file for complete search history.

(56) References Cited

U.S. PATENT DOCUMENTS

| | | | |
|---|---|---|---|
| 4,533,844 A * | 8/1985 | Miller et al. | 327/59 |
| 4,739,281 A * | 4/1988 | Doyle | 330/253 |
| 5,038,055 A * | 8/1991 | Kinoshita | 327/58 |
| 5,291,149 A * | 3/1994 | Nunoshima | 330/255 |
| 5,818,295 A * | 10/1998 | Chimura et al. | 327/561 |
| 6,020,768 A * | 2/2000 | Lim | 327/77 |
| 6,323,695 B1 * | 11/2001 | Heinrich | 327/89 |
| 6,566,852 B2 | 5/2003 | Tagami et al. | |
| 6,642,791 B1 * | 11/2003 | Balan | 330/253 |
| 7,148,724 B2 | 12/2006 | Oguri | |
| 7,495,478 B2 * | 2/2009 | Takeuchi et al. | 327/51 |

FOREIGN PATENT DOCUMENTS

JP    2001-325034    11/2001
JP    2006-311419    11/2006

* cited by examiner

*Primary Examiner*—Tuan Lam
(74) *Attorney, Agent, or Firm*—McGinn IP Law Group, PLLC (57) ABSTRACT

Disclosed is a signal output circuit comprising: a first transistor of an emitter follower configuration, which receives an input signal; a second transistor of an emitter follower configuration, which receives the input signal, and has an output connected to an external load (106); a comparator circuit which has an input pair connected via resistors to emitters of the first and the second transistors; a first current mirror circuit which has an input connected to an output of a first current source transistor and an output connected to an emitter of the first transistor; and a second current mirror circuit which has an input connected to a connection node of an output of a second current source transistor and an output of the comparator circuit, and has an output connected to an emitter of the second transistor.

8 Claims, 6 Drawing Sheets

SIGNAL OUTPUT CIRCUIT

FIELD OF THE INVENTION

Reference to Related Application

This application is based upon and claims the benefit of the priority of Japanese patent application No. 2008-078468 filed on Mar. 25, 2008, the disclosure of which is incorporated herein in its entirety by reference thereto.

The present invention relates to a signal output circuit of an optical receiver circuit, and in particular, to a signal output circuit and an optical receiver circuit that can handle lower voltages in power supply voltage.

BACKGROUND

In recent years, along with lower power dissipation in portable devices, as an operational requirement in lowering of voltage, there is a need to ensure a dynamic range of an output voltage on Vcc-side and to maintain a slew rate when there is a load variation. Power supply voltage Vcc is reduced from 5V to 4V or 3.3V, and ensuring a Vcc side maximum output is important. This becomes larger as a power supply voltage become lower.

Figure 5:
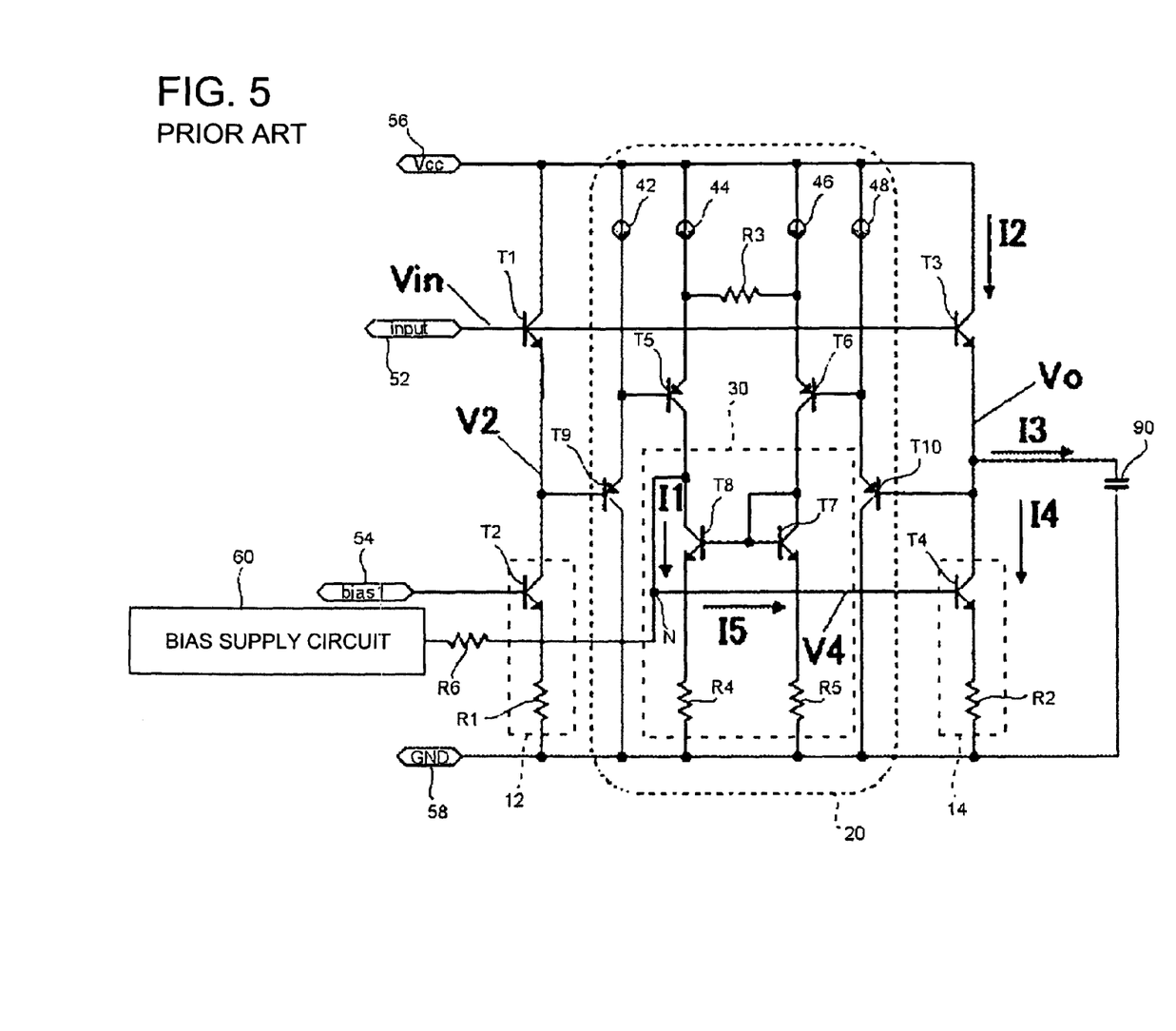
FIG. 5 is a diagram showing a configuration of related technology (Patent Document 1).

FIG. 5 is a diagram showing a configuration of a signal output circuit disclosed in Patent Document 1. The signal output circuit is provided with a first and a second emitter follower circuit and a comparator 20.

The first emitter follower circuit has an NPN bipolar transistor T1 and a constant current source 12. A base of the transistor T1 is connected to an input signal terminal 52, and a collector is connected to a power supply terminal (Vcc) 56. The constant current source 12 includes an NPN bipolar transistor T2 and a resistor element R1. A collector of the transistor T2 is connected to an emitter of the transistor T1, a base is connected to a bias signal terminal (bias1) 54, and an emitter is connected to a ground terminal 58 via the resistor element R1.

The second emitter follower circuit has an NPN bipolar transistor T3 and a constant current source 14. A base of the transistor T3 is connected to the input signal terminal 52, and a collector is connected to the power supply terminal 56.

The comparator 20 receives output signals from the first and second emitter follower circuits, makes a comparison as to magnitude relationship between the received signals, and outputs a result. The comparator 20 includes transistors T5 and T6 forming a differential pair, a resistor element R3, and a current mirror circuit 30 including transistors T7 and T8. The resistor element R3 is connected between emitters of the transistors T5 and T6. The current mirror circuit 30 is connected to collectors of the transistors T5 and T6. The comparator 20 further includes PNP bipolar transistors T9 and T10, and constant current sources 42, 44, 46, and 48. The transistor T9 has an emitter connected to a base of the transistor T5, has a base connected to an output of the first emitter follower circuit (the emitter of the transistor Ti), and has a collector connected to the ground terminal 58. The transistor T10 has an emitter connected to a base of the transistor T6, has a base connected to an output of the second emitter follower circuit (the emitter of the transistor T3), and has a collector connected to the ground terminal 58.

The constant current source 42 is connected between an emitter of the transistor T9 and the power supply terminal 56. The constant current source 44 is connected between an emitter of the transistor T5 and the power supply terminal 56. The constant current source 46 is connected between an emitter of the transistor T6 and the power supply terminal 56. The constant current source 48 is connected between an emitter of the transistor T10 and the power supply terminal 56.

An output of the second emitter follower circuit (the emitter of the transistor T3) is connected to an external load 90. The comparator 20 performs voltage comparison between an output voltage Vo of the second emitter follower circuit and an output (the emitter of the transistor T1) voltage V2 of the first emitter follower circuit. When a voltage shift between Vo and V2 due to the external load occurs, the comparator 20 controls so that a current is supplied to the second emitter follower circuit (T3) connected to the load 90, by a bias supply circuit 60, and the voltage shift is remedied.

Figure 6:
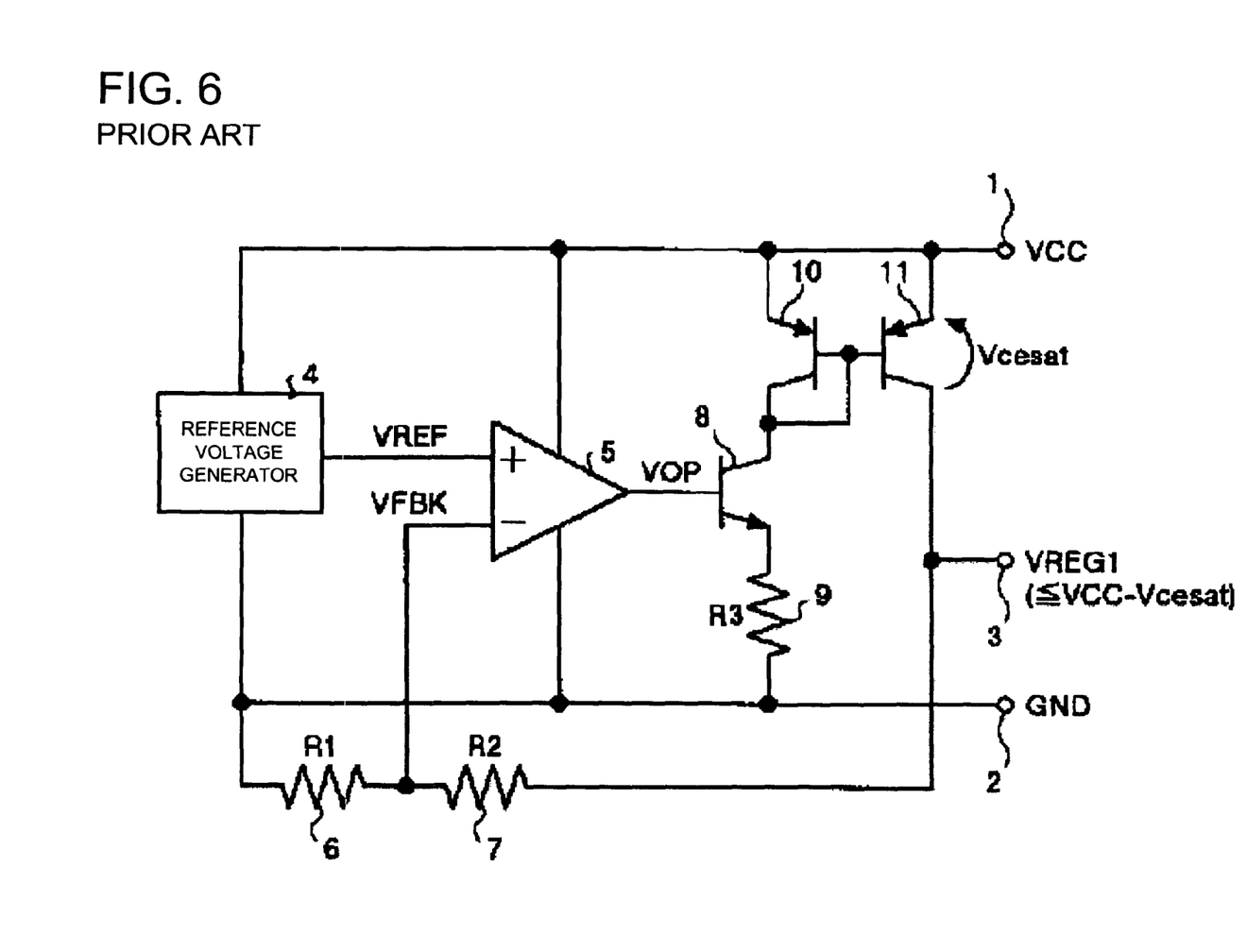
FIG. 6 is a diagram showing a configuration of related technology (Patent Document 2).

FIG. 6 is a diagram showing a configuration of a voltage generator disclosed in Patent Document 2. The voltage generator includes: an NPN bipolar transistor 8 having a base supplied with a voltage VOP output by an error detector (OP amplifier) 5 that receives a reference voltage VREF from a reference voltage generator 4 and a feedback voltage VFBK, to detect an error; a current mirror circuit including PNP bipolar transistors 10 and 11, which outputs a current obtained by multiplying a current flowing in the NPN bipolar transistor 8; and resistors 6 and 7 which cause generation of the feedback voltage VFBK to the error detector 5 from an output voltage VREG generated by current flowing in the current mirror circuit. A circuit of FIG. 6 is adapted to set an output voltage up to a power supply voltage Vcc-Vsat (saturation voltage between collector and emitter). An output voltage can be set by the feed back voltage VFBK which is an output of dividing resistors (R1 and R2) connected between an output 3 and GND and the reference voltage VREF from a reference voltage generator 4. At this time, the output voltage is constant. When an output current has become large, in order to be supply a PNP bipolar transistor 11, an output voltage VOP of the error detector (OP amplifier) 5 increases in order that a current flows to a PNP bipolar transistor 10, a collector current of the PNP bipolar transistor 10 increases, and a collector current of the PNP bipolar transistor 11 forming a current mirror with the PNP bipolar transistor 10, increases. By this configuration, stable voltage is obtained even when an output current fluctuates.

[Patent Document 1]
JP Patent Kokai Publication No. JP-P2006-311419A

[Patent Document 2]
JP Patent Kokai Publication No. JP-P2001-325034A

The entire disclosure of Patent Documents 1 and 2 is incorporated herein by reference thereto.

The following analyses are given by the present invention.

In the configuration shown in FIG. 5, an emitter follower is used by an NPN transistor as signal output, and maximum output voltage on the power supply voltage Vcc side is less than or equal to Vcc-Vbe (Vbe is emitter-base voltage). As a result, due to lowering of the power supply voltage Vcc, an output amplitude becomes smaller.

In the configuration shown in FIG. 6, an output voltage (DC) can be set to Vcc-Vsat on the power supply voltage Vcc side. However with regard to an AC signal and a pulse signal, when output is falling, an output signal waveform becomes dull (that is, slew rate decreases). In addition, in order to set a voltage, resistors 6 and 7 (R1 and R2) for determining set voltage are necessary. The circuit shown in FIG. 6 can cope with the increasing fluctuations of a current flowing through a load. When the current flowing through the load decreases, since there are resistors (R1 and R2) for setting the output voltage, the output signal waveform becomes dull.

SUMMARY

The invention which seeks to solve one or more of the above problems is summarized as follows.

According to the present invention there is provided a signal output circuit including:

a first transistor of an emitter follower configuration, the first transistor receiving an input signal;

a second transistor of an emitter follower configuration, the second transistor receiving the input signal and having an emitter connected to an external load;

a comparator circuit having an input pair for receiving emitter outputs of the first and the second transistors and comparing the received emitter outputs of the first and the second transistors;

a first current mirror circuit having an input connected to an output of a first current source, and having an output connected to the emitter of the first transistor; and a second current mirror circuit having an input connected to a connection node of an output of a second current source and an output of the comparator circuit, and having an output connected to the emitter of the second transistor.

In the present invention, the emitters of the first and second transistors are respectively connected to the input pair of the comparator circuit via first and second resistors.

In another aspect of the present invention, there is provided an optical receiver circuit including:

an optical detector which detects light and outputs a current;

a current-to-voltage conversion circuit which converts an output current of the optical detector to a voltage; and a signal output circuit which receives an output of the current-to-voltage conversion circuit. The signal output circuit includes the abovementioned signal output circuit according to the present invention. In the present invention, the current-to-voltage conversion circuit includes a differential amplifier having an inverting input terminal connected to a cathode of a photodiode included by the optical detector, and having a non-inverting input terminal supplied with a prescribed reference voltage. The signal output circuit receives an output signal of the differential amplifier as an input signal. The emitter output of the first transistor of the signal output circuit is connected to the inverting input terminal of the differential amplifier via a feedback resistor.

According to the present invention, a signal amplitude is able to be ensured even in case of lowering of a power supply voltage and slew rate of an output waveform is also able to be ensured, thereby making it possible to cope with lower power dissipation.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

The exemplary embodiments will be now described with reference to the accompanying drawings. According to one aspect of the present invention, there are provided a signal output circuit which includes:

a first transistor (Q11) of an emitter follower configuration, which receives an input signal;

a second transistor (Q8) of an emitter follower configuration, which receives the input signal (input), and which has an output ( ) emitter) connected to an external load (106);

a comparator circuit (104) which has an input pair for receiving emitter outputs (V1 and Vo) of the first and the second transistors (Q11 and Q8) and performs a comparison of emitter outputs (V1 and Vo);

a first current mirror circuit (Q9, Q10) which has an input connected to output of a first current source transistor (Q13), and has an output connected to an emitter of the first transistor (Q11); and a second current mirror circuit (Q6, Q7) which has an input connected to a connection node of an output of a second current source transistor (Q14) and an output of the comparator circuit (104), and has an output connected to an emitter of the second transistor (Q8).

The outputs (emitters) of the first and second transistors (Q11 and Q8) are respectively connected to the input pair (bases of Q1 and Q2) of the comparator circuit (104) via resistors (R1 and R2).

The first and second current source transistors (Q13 and Q14) are biased by a common bias voltage.

According to the configuration of the present invention, a dynamic range on a power supply voltage (Vcc) side is secured. In addition, according to the comparator circuit (104), by performing control so that a transitioning characteristic of Vo follows V1 and by performing control to vary current of an output part emitter follower (Q8), in accordance with fluctuations of the load, a decrease in a slew rate of an output signal waveform is able to be avoided. By connecting the outputs (emitters) of the first and second transistors (Q11 and Q8) to the input pair (bases of Q1 and Q2) of the comparator circuit (104) via the resistors (R1 and R2), stable operation is made possible also with low power supply voltage.

Figure 1:
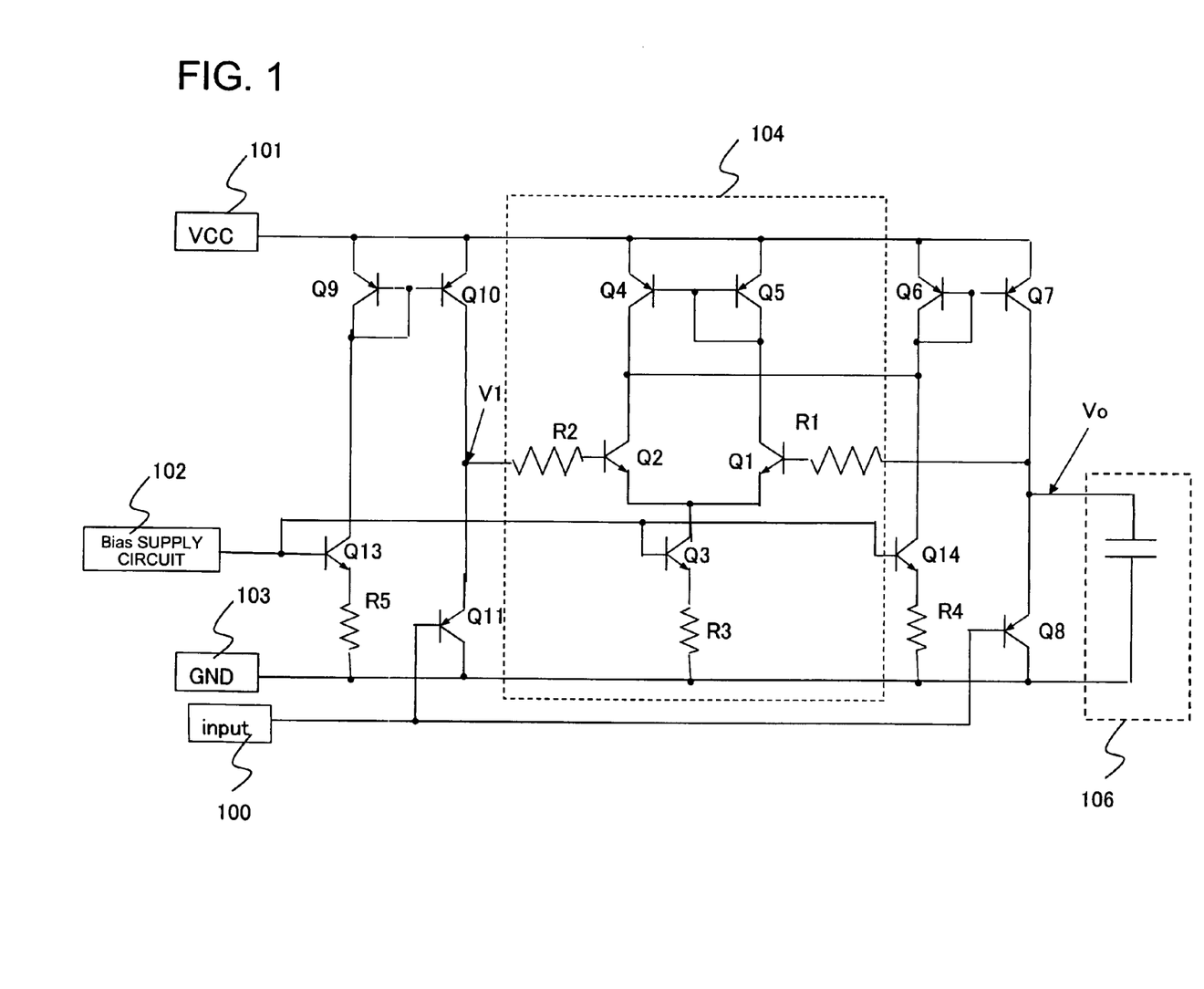
FIG. 1 is a diagram showing a circuit configuration of a first exemplary embodiment of the present invention.

FIG. 1 is a diagram showing a configuration of an exemplary embodiment of the present invention. Referring to FIG. 1, the signal output circuit includes:

(a) a resistor R3, one end of which is connected to ground (GND) 103;

(b) an NPN bipolar transistor Q3 having an emitter connected to the other end of the resistor R3, and having a base supplied with a bias voltage from a bias supply circuit 102;

(c) NPN bipolar transistors Q1 and Q2 having emitters coupled together;

(d) a PNP bipolar transistor Q4 having a collector connected to a collector of the bipolar transistor Q2, and having an emitter connected to a power supply terminal (Vcc) 101, and (e) a PNP bipolar transistor Q5 having an emitter connected to the power supply terminal (Vcc) 101, having a base connected to a base of the bipolar transistor Q4, and having the emitter and the base connected in common to a collector of the bipolar transistor Q1.

The bipolar transistors Q1 and Q2 form a differential pair. The bipolar transistors Q4 and Q5 form a current mirror and serves as an active load of the differential pair (Q1, Q2).

The signal output circuit further includes:

(f) a PNP bipolar transistor Q9 having an emitter connected to the power supply terminal (Vcc) 101, and having a base and collector coupled together;

(g) an NPN bipolar transistor Q13 having a collector connected to a collector of the bipolar transistor Q9, and having a base supplied with a bias voltage from the bias supply circuit 102;

(h) a resistor R5 connected between GND and an emitter of the bipolar transistor Q13;

(i) a PNP bipolar transistor Q10 having an emitter connected to the power supply terminal (Vcc) 101, and having a base connected to a base of the bipolar transistor Q9; and (j) a PNP bipolar transistor Q11 having an emitter connected to GND, having a base supplied with an input signal, and having a collector connected to a collector of the bipolar transistor Q10.

A connection node of the collector of the bipolar transistor Q10 and an emitter of the bipolar transistor Q11 is connected to the base of the bipolar transistor Q2 via the resistor R2.

The signal output circuit further includes:

(k) a PNP bipolar transistor Q6 having an emitter connected to the power supply terminal (Vcc) 101, and having a collector and base coupled together;

(l) a bipolar transistor Q14 having an emitter connected to GND via a resistor R4, having a base supplied with a bias voltage from a bias supply circuit 102, and having a collector to a connection node of a collector of the bipolar transistor Q4 and the collector and base of the bipolar transistor Q6;

(m) a resistor R4 connected between GND and an emitter of the bipolar transistor Q14;

(n) a PNP bipolar transistor Q7 having an emitter connected to the power supply terminal (Vcc) 101, and having a base connected to a base of the bipolar transistor Q9; and (o) a PNP bipolar transistor Q8 having a collector connected to GND, having a base supplied with an input signal, and having an emitter connected to the external load 106.

A connection node of the collector of the bipolar transistor Q7 and an emitter of the bipolar transistor Q8 is connected to the base of the bipolar transistor Q1 via the resistor R1.

The transistor Q11 constitutes a first emitter follower circuit, and the transistor Q8 constitutes a second emitter follower circuit. The transistor Q13 and the resistor R5 constitute the first current source. The transistor Q14 and the resistor R4 constitute the second current source. The transistor Q3 and the resistor R3 constitute a third current source. The differential transistor pair (Q1, Q2), the constant current source (Q3, R3), the current mirror (Q4, Q5), and the resistor elements R1 and R2 constitute a comparator circuit 104.

In the signal output circuit, when a pulse signal (High pulse) is received on the power supply voltage Vcc side from a certain reference voltage and is output at an output side Vo (the emitter of the emitter follower transistor Q8) and at an internal node V1 (the emitter of the emitter follower transistor Q11), since the load 106 is connected to Vo, a signal change for supplying current to the load 106 appears as a voltage shift between V0 and V1. This voltage shift between Vo and V1 is detected by the comparator circuit 104. When, for example, Vo<V1, current is supplied in order to increase current flowing in the current source transistor (Q7) connected to the output of the PNP emitter follower (Q8) on the Vo side.

Figure 2A:
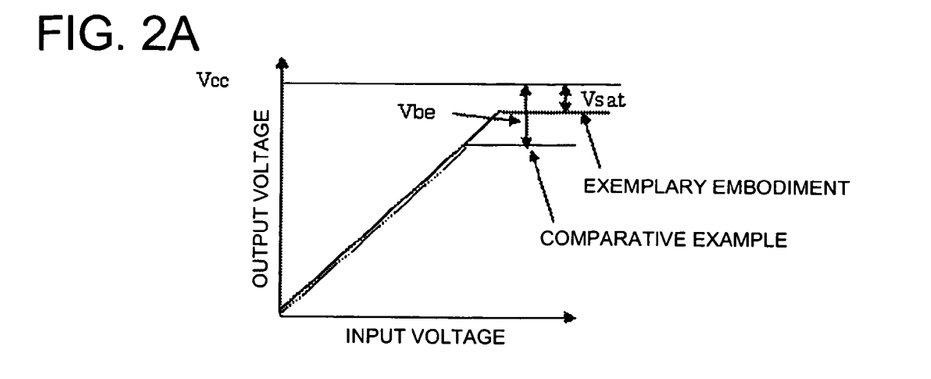
FIGS. 2A to 2C are diagrams comparing and describing an input output characteristic of a comparative example and an exemplary embodiment of the present invention.
Figure 2B:
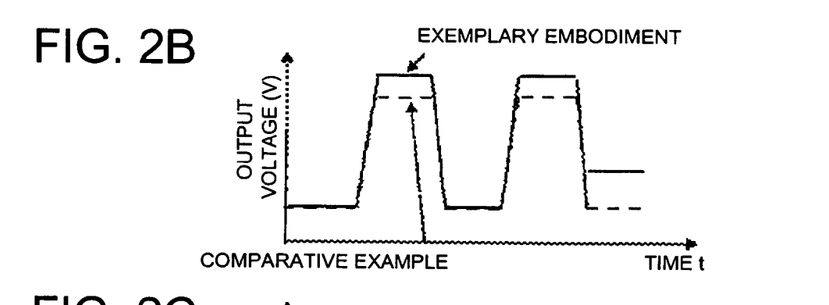
Figure 2C:
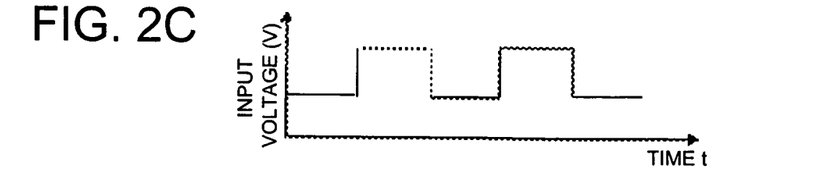

With regard to maximum output voltage and output amplitude, as shown in FIGS. 2A to 2C, an improvement is possible as far as Vcc-Vsat (PNP transistor collector-emitter saturation voltage).

With regard to output voltage rising time, a relationship of current and capacitance load is $$t=V/(I \times CL) \tag{1}$$

where

V is an output voltage range,

I is a load supply current, t: is a voltage supply time, and

CL is a capacitance load.

From equation (1), the slew rate has a dependency on load capacitance and load current. Therefore, the slew rate deteriorates by a load change under a constant current.

In the present exemplary embodiment, in order to improve the dependency of the slew rate on load capacitance and current, by variably controlling base current of the current source transistor Q7 connected to output of the PNP emitter follower Q8 in accordance with change of the output voltage Vo, a characteristic that does not depend on fluctuation of the load 106 can be realized.

When the output voltage Vo approaches the power supply voltage Vcc, by emitter-to-collector voltage of the current source transistor Q7 decreasing, a direct current amplification factor hfe decreases, so that it is necessary to increase the base current.

As the constant current supplied to the comparator circuit 104, by having a collector current required in saturation flow, it is possible to supply a sufficient base current to the transistor Q8.

As an example of lowering of the power supply voltage, with operation requirement of, from Vcc=5V to 4V, or 5V to 3.3V, it is necessary to secure a Vcc side dynamic range of an output voltage and to maintain the slew rate, when load changes. With the present invention, this requirement is able to be realized.

An output voltage against a certain square wave input voltage will be illustrated in order to perform comparison of characteristics between the present exemplary embodiment and a comparative example (a circuit in related technology). A characteristic (input-to-output characteristic) as shown in FIG. 2A is obtained. According to the present exemplary embodiment, the output voltage maintains a characteristic equivalent to the comparative example (the circuit in the related technology), and a configuration is obtained in which it is possible to improve the maximum output voltage. FIG. 2B is a diagram showing, for the comparative example (the circuit in the related technology) and the present exemplary embodiment, output voltage waveforms (transient characteristic in a time region) when the square wave input voltage (refer to FIG. 2C) is applied.

Figure 3:
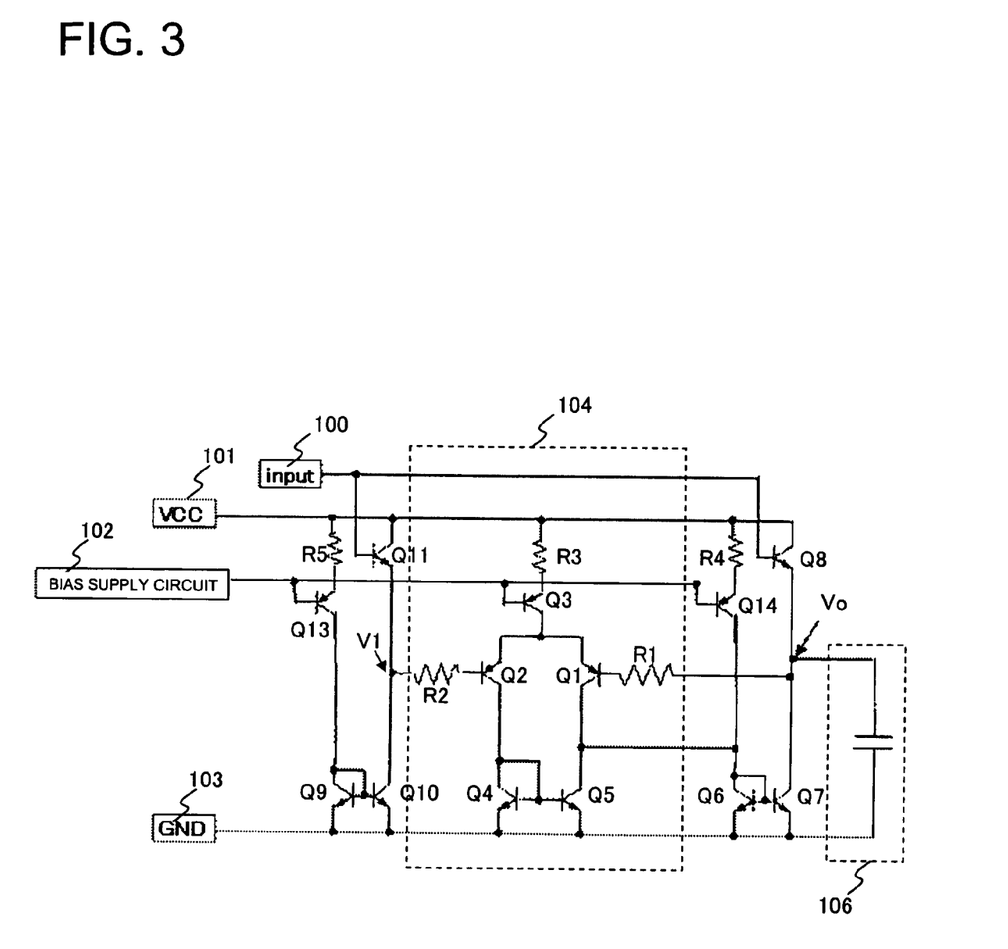
FIG. 3 is a diagram showing a circuit configuration of a second exemplary embodiment of the present invention.

FIG. 3 is a diagram showing a configuration of a second exemplary embodiment of the present invention. In the configuration of FIG. 3, transistor polarity (conductivity type), with regard to FIG. 1, is reversed. Transistors Q1, Q2, Q3, Q11, Q13, Q8, and Q14 are PNP bipolar transistors, and transistors Q4, Q5, Q6, Q7, Q9, and Q10 are NPN bipolar transistors.

According to the present exemplary embodiment, by being able to secure a dynamic range on a power supply voltage Vcc side, and to secure a slew rate, it is made possible in lowering of a power supply voltage to ensure a signal amplitude and slew rate, thereby achieving lower power dissipation.

Figure 4:
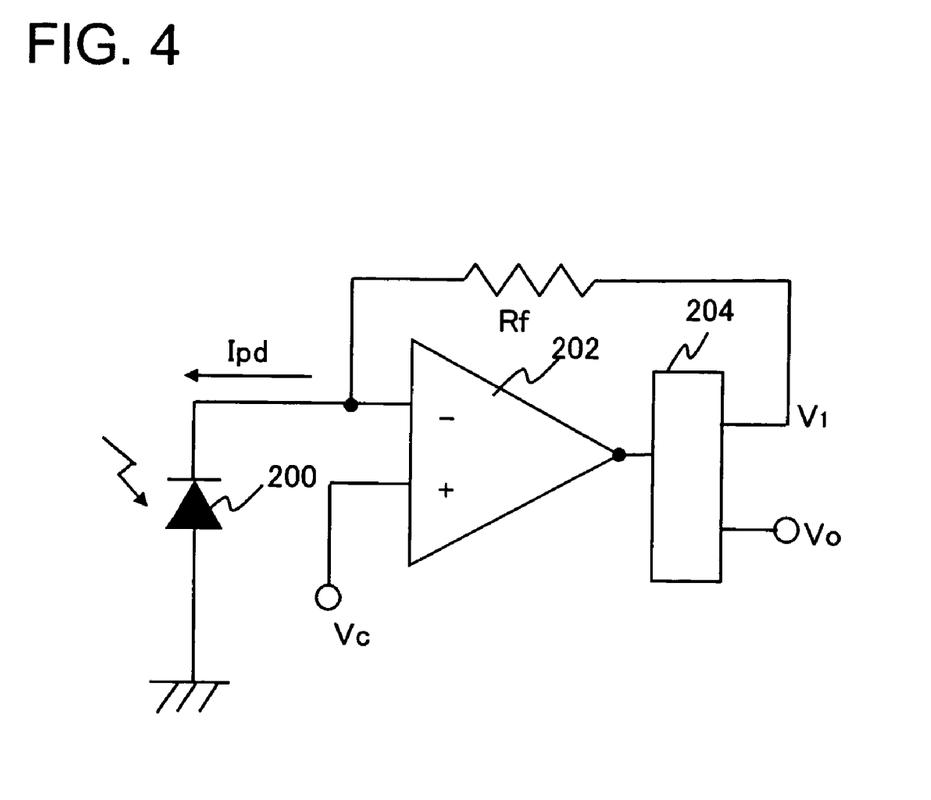
FIG. 4 is a diagram showing a circuit configuration of a third exemplary embodiment of the present invention.

FIG. 4 is a diagram showing a configuration of a third exemplary embodiment of the present invention. The optical receiver circuit includes: a differential amplifier circuit (OP amplifier) 202, having an inverting input terminal (−) connected to a cathode terminal of a photodiode 200 forming an optical detector, and having a non-inverting input terminal (+) supplied with a reference voltage Vc and a signal output circuit (204) according to the present invention, connected to output of the differential amplifier circuit (OP amplifier) 202.

With regard to the signal output circuit 204, an internal node V1 (for example, V1 in FIG. 1) is connected to the inverting input terminal (−) of the differential amplifier circuit (OP amplifier) 202, via a feedback resistor Rf. The differential amplifier circuit (OP amplifier) 202 functions as a current-to-voltage converter.

When light is radiated to the photodiode 200, Ipd flows in a feedback resistor Rf, and a voltage (Vc+Rf×Ipd), obtained from Rf×Ipd with a reference voltage Vc as a reference, is output to an output terminal Vo. At this time, the output Vo varies in a plus-direction more than the reference voltage Vc and hence a circuit according to the present invention is in particular effective in order to secure an output amplitude for a low power supply voltage operation.

Points of difference between the present exemplary embodiment and the related art will now be described.

Under a low power supply voltage condition (for example, a power supply voltage Vcc of 3.3V), in case where a configuration of the comparator 20 of the related art of FIG. 5 is applied, since the constant current sources 44 and 46 are considered to be configured by commonly used transistors, a range of the input voltage (Vo and V2), at which the comparator 20 can be stably operated, becomes extremely limited, and a desired characteristic cannot be obtained. This is because input of the comparator 20 is configured by 2 transistors T5 and T9, or T6 and T10, and hence with an input voltage of ½ Vcc or the like, transistors making up a constant current are saturated.

With the circuit according to the present exemplary embodiment, in order to enable an operation at a time of low power supply voltage, by a configuration of the comparator in which a Darlington connection configuration is not adopted as in the related art of FIG. 5, and in which there is provided one input transistor and a resistor is connected to a base of the input transistor, stable operation is made possible even in a low power supply voltage operation. The base potential of the transistor Q1 of the differential pair is of a value obtained by subtracting a voltage drop of [base current]×[base resistance R1] from an output Vo of a second emitter follower circuit (Q8) connected to a load (106) and the base potential of the transistor Q2 of the differential pair is of a value obtained by subtracting a voltage drop of [base current]×[base resistance R2] from an output V1 of a first emitter follower circuit (Q11). By optimizing element parameters, even when Vo and V1 increase, stable operation is made possible without the differential pair transistors Q1 and Q2 being saturated.

Furthermore, in the related art of FIG. 5, the resistors R1 and R2 that determine a bias current are provided. When this configuration is applied to the circuit of the present exemplary embodiment, an amplitude of an output signal is limited. In the present exemplary embodiment, the bias current of an output section is supplied by a current mirror circuit. With this configuration, the output amplitude is able to be expanded up to Vcc−Vsat.

Each disclosure of the above mentioned Patent Documents 1 and 2 is incorporated by reference into the present document. Modifications and adjustments of exemplary embodiments and examples are possible within bounds of the entire disclosure (including the scope of the claims) of the present invention, and also based on fundamental technological concepts thereof. Furthermore, a wide variety of combinations and selections of various disclosed elements are possible within the scope of the claims of the present invention. That is, the present invention clearly includes every type of transformation and modification that a person skilled in the art can realize according to technological concepts and the entire disclosure including the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A signal output circuit comprising:
   a first transistor of an emitter follower configuration, the first transistor receiving an input signal;
   a second transistor of an emitter follower configuration, the second transistor receiving the input signal and having an emitter connected to an external load;
   a comparator circuit having an input pair for receiving emitter outputs of the first and the second transistors and comparing the received emitter outputs of the first and the second transistors;
   first and second current sources;
   a first current mirror circuit having an input connected to an output of the first current source, and having an output connected to the emitter of the first transistor; and
   a second current mirror circuit having an input connected to a connection node of an output of the second current source and an output of the comparator circuit, and having an output connected to the emitter of the second transistor.

2. The signal output circuit according to claim 1, wherein the emitters of the first and second transistors are connected to the input pair of the comparator circuit via first and second resistors, respectively.

3. The signal output circuit according to claim 1, wherein the first and second current sources are biased by a common bias voltage.

4. The signal output circuit according to claim 2, wherein the comparator circuit comprises:
   differential pair transistors having bases connected to one ends of the first and second resistors, respectively, and having emitters coupled together, the bases of the differential pair transistors constituting the input pair of the comparator circuit;
   a third current source having an output connected to the coupled emitters of the differential pair transistors; and
   a load circuit connected to a pair of collectors of the differential pair transistors;
   the third current source along with the first and the second current sources being biased by a common bias voltage from a bias supply circuit.

5. The signal output circuit according to claim 4, wherein the first and the second transistors of an emitter follower configuration, and each transistor constituting the first and the second current mirror circuits and the load circuit of the comparator circuit are PNP bipolar transistors, and each transistor constituting the first to the third current source, and each of the differential pair transistors of the comparator circuit are NPN bipolar transistors.

6. The signal output circuit according to claim 4, wherein the first and the second transistors of an emitter follower configuration, and each transistor constituting the first and the second current mirror circuits and the load circuit of the comparator circuit are NPN bipolar transistors, and each transistor constituting the first to the third current source, and each of the differential pair transistors of the comparator circuit are PNP bipolar transistors.

7. An optical receiver circuit comprising:

an optical detector which detects light and outputs a current;

a current-to-voltage conversion circuit which converts an output current of the optical detector to a voltage; and a signal output circuit which receives an output of the current-to-voltage conversion circuit, the signal output circuit including the signal output circuit as set forth in claim 1.

8. The optical receiver circuit according to claim 7, wherein the current-to-voltage conversion circuit comprises a differential amplifier having an inverting input terminal connected to a cathode of a photodiode included by the optical detector, and having a non-inverting input terminal supplied with a prescribed reference voltage;

the signal output circuit receives an output signal of the differential amplifier as the input signal; and the emitter output of the first transistor of the signal output circuit is connected to the inverting input terminal of the differential amplifier via a feedback resistor.

* * * * *